United States Patent [19]

Aoshima

[11] Patent Number: 5,171,655
[45] Date of Patent: Dec. 15, 1992

[54] PHOTOHARDENABLE LIGHT-SENSITIVE COMPOSITION

[75] Inventor: Keitaro Aoshima, Shizuoke, Japan

[73] Assignee: Fuji Photo Film Co., Ltd., Minami-Ashigara, Japan

[21] Appl. No.: 561,926

[22] Filed: Aug. 2, 1990

[30] Foreign Application Priority Data

Aug. 3, 1989 [JP] Japan .................. 1-201793
Aug. 18, 1989 [JP] Japan .................. 1-212699
Aug. 18, 1989 [JP] Japan .................. 1-212700

[51] Int. Cl.$^5$ .............................. G03F 7/038
[52] U.S. Cl. ........................ 430/138; 430/283; 430/270; 522/149; 522/152; 525/282; 523/223
[58] Field of Search ............. 430/138, 283, 270; 525/282; 523/223; 522/149, 152

[56] References Cited

U.S. PATENT DOCUMENTS

| | | | |
|---|---|---|---|
| 3,920,618 | 11/1975 | Ichimura et al. | 522/149 X |
| 4,079,041 | 3/1978 | Baumann et al. | 430/270 X |
| 4,251,618 | 2/1981 | McCartin et al. | 430/270 |
| 4,956,252 | 9/1990 | Fryd et al. | 430/138 |
| 4,957,850 | 9/1990 | Kusuda et al. | 430/306 X |

FOREIGN PATENT DOCUMENTS

| | | | |
|---|---|---|---|
| 0230936 | 8/1987 | European Pat. Off. | |
| 0251228 | 1/1988 | European Pat. Off. | 430/306 |

*Primary Examiner*—Cynthia Hamilton
*Attorney, Agent, or Firm*—Burns, Doane, Swecker & Mathis

[57] ABSTRACT

A photohardenable composition comprises a microgel carrying a group of the formula (I) or (II); or a microgel carrying a group of the formula (III) and at least one acidic group, such as —SO$_3$H, —CONHSO$_2$, —O-CO—NH'SO$_2$—, —CONHCO—, —SO$_2$NH—, a phenolic hydroxyl group and/or —COCH$_2$COO—:

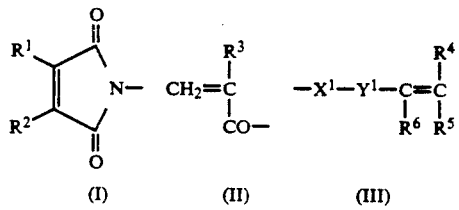

(wherein R$^1$ and R$^2$ each represents a hydrogen atom, a halogen atom, or an alkyl or aryl group, provided that R$^1$ and R$^2$ may form a ring together with the carbon atoms to which they are bonded; R$^3$ represents a hydrogen atom or a methyl group; R$^4$, R$^5$ and R$^6$ each represents a hydrogen atom, a halogen atom, or a substituted or unsubstituted C$_1$ to C$_{20}$ alkyl, aryl, alkoxy or aryloxy group; X$^1$ represents —CO—O—, —CO—NH— or —O—; and Y$^1$ represents, for instance, a single bond or a methylene group). The light-sensitive composition is excellent in sensitivity during exposure to light and can provide well-acceptable images even when it is exposed to light for only a short period of time. Moreover, its workability is substantially improved and the composition exhibits sufficient sensitivity even to a scanning exposure with laser rays.

10 Claims, No Drawings

PHOTOHARDENABLE LIGHT-SENSITIVE COMPOSITION

BACKGROUND OF THE INVENTION

The present invention relates to a light-sensitive composition which is favorably used for preparing, for instance, presensitized plates for use in making lithographic printing plates (hereinafter referred to as "PS plates"), IC circuits and photomasks and in particular to a novel light-sensitive composition improved in sensitivity during exposure to light.

Photo-crosslinkable substances which cross-link through a cyclization-addition reaction have been well-known and have widely been employed as a principal component of a light-sensitive composition for use in making PS plates or the like. Among them, effectively used photo-crosslinkable polymeric compounds are polymers having a maleimido group at a side chain and a polymer having, in the main chain or at a side chain, a cinnamyl, cinnamylidene and/or chalcon group carrying a photodimerizable unsaturated double bond adjacent to an aromatic nucleus. In particular, the polymers having a maleimido group are useful because of their high sensitivity. Examples of a light-sensitive composition containing such polymeric compounds carrying a maleimido group are those disclosed in Japanese Patent Unexamined Publication (hereinafter referred to as "J. P. KOKAI") Nos. Sho 52-988, Sho 52-3055 and Sho 55-160010.

On the other hand, many attempts have been made to use a photopolymerizable light-sensitive composition as a light-sensitive image-forming layer of PS plates or the like. For instance, there have been proposed a basic composition which comprises a polymer serving as a binder, a monomer and a photopolymerization initiator as disclosed in Japanese Patent Publication for Opposition Purpose (hereinafter referred to as "J. P. KOKOKU") No. Sho 46-32714; a composition whose hardening efficiency is improved by the introduction of unsaturated double bonds into a polymer as a binder as disclosed in J. P. KOKOKU No. Sho 49-34041; and a composition in which a novel photopolymerization initiator is employed as disclosed in J. P. KOKOKU Nos. 48-38403 and Sho 53-27605 and U.K. Patent No. 1,388,492. Some of these compositions have already been put into practical use.

However, all of the foregoing conventional light-sensitive compositions do not have sufficient sensitivity and they cannot provide acceptable images when they are exposed to light for only a short period of time.

SUMMARY OF THE INVENTION

Accordingly, the object of the present invention is to provide a highly sensitive negative-working photohardenable light-sensitive composition which can form well acceptable images even when it is exposed to light for only a short period of time.

The inventors of this invention have conducted various studies to achieve the foregoing object and have found out that the object can effectively be achieved by the use of a novel light-sensitive composition. The present invention has been completed based on this finding.

According to one aspect of the present invention, there is provided a photohardenable composition which comprises a microgel carrying a group represented by the following general formula (I) or (II):

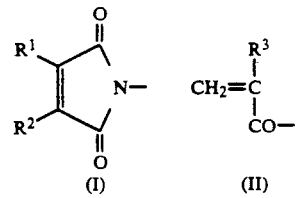

(wherein $R^1$ and $R^2$ each represents a hydrogen atom, a halogen atom, or an alkyl or aryl group, provided that $R^1$ and $R^2$ may form a ring together with the carbon atoms to which they are bonded; and $R^3$ represents a hydrogen atom or a methyl group). In this case, the microgel may further has an acidic group possessing a pKa of not more than 14.

According to another aspect of the present invention, there is provided a photohardenable composition which comprises a microgel carrying a functional group represented by the following general formula (III):

(wherein $R^4$, $R^5$ and $R^6$ each represents a hydrogen atom, a halogen atom, or a substituted or unsubstituted $C_1$ to $C_{20}$ alkyl, aryl, alkoxy or aryloxy group; $X^1$ represents —CO—O—, —CO—NH— or —O—; and $Y^1$ represents a single bond, a methylene group or a group:

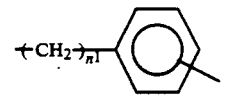

(wherein $n^1$ is an integer ranging from 0 to 20)), and at least one acidic group selected from the group consisting of —SO$_3$H, —CONHSO$_2$—, —OCO—NH—SO$_2$—, —CONHCO—, —SO$_2$NH—, a phenolic hydroxyl group, —COCH$_2$COO—,

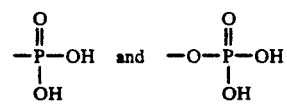

DETAILED EXPLANATION OF THE INVENTION

The present invention will hereunder be explained in more detail.

In the foregoing general formula (I), $R^1$ and $R^2$ each preferably represents a hydrogen atom, a chlorine atom, a bromine atom, a $C_1$ to $C_6$ alkyl group, a substituted or unsubstituted phenyl group, provided that $R^1$ and $R^2$ may form a ring together with the carbon atoms to which they are bonded.

The term "microgel", which has the functional group represented by the general formula (I) or (II) and may have an acidic group possessing a pKa of not more than 14 herein, means a spherical polymeric compound (particles) having a cross-linked structure and a diameter ranging from 0.01 to 1 μm, which can be prepared by emulsion polymerization or the like. The production and use of microgels are detailed in, for instance, U.K. Patent No. 967,051 and U.S. Pat. No. 3,895,082.

The microgels having a photo-crosslinkable group represented by the formula (I) which are preferably used in the present invention can be prepared from the following compounds respectively belonging to Groups A and B and optionally the following compounds belonging to Group C and they are preferably obtained through emulsion polymerization or dispersion polymerization.

Group A: Compounds having the photo-crosslinkable group represented by the formula (I) and a polymerizable ethylenically unsaturated bond (these compounds are preferably used in an amount ranging from 10 to 99 mole %).

Examples of such compounds preferably used in the present invention are those represented by the following general formulae:

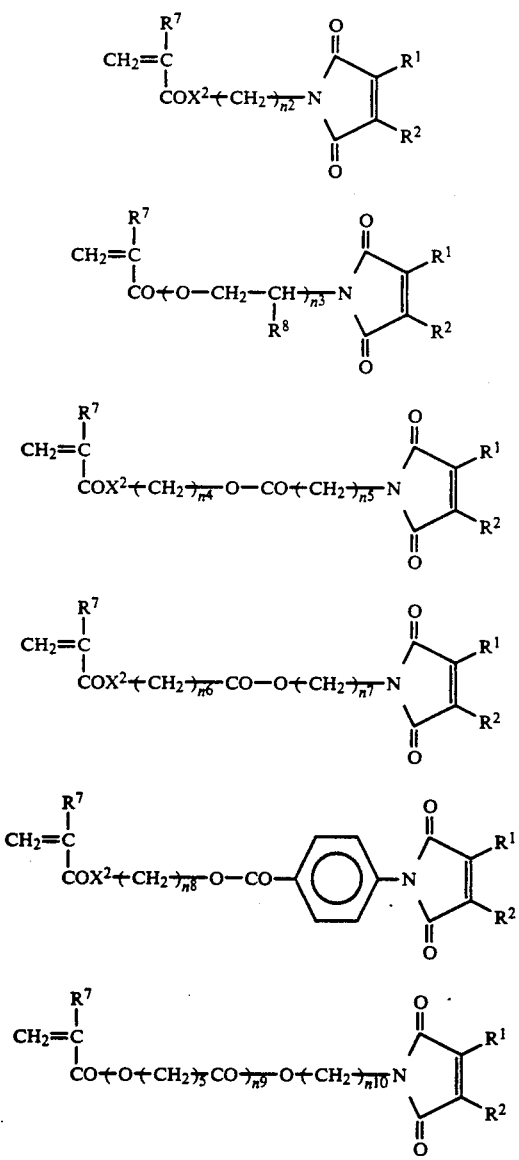

In the foregoing general formulae, $R^1$ and $R^2$ are the same as those defined above; $R^7$ and $R^8$ each represents a hydrogen atom or a methyl group; $X^2$ represents —O— or —NH—; $n^2$ to $n^{10}$ each represents an integer of not less than 1.

In addition, the compounds disclosed in U.S. Pat. No. 4,079,041 are also preferably used in the present invention.

Group B: Compounds carrying at least two polymerizable ethylenically unsaturated bonds in the molecule (cross-linking agents; these compounds are preferably used in an amount ranging from 1 to 50 mole %).

Examples of such compounds which are preferably used in the present invention are methacrylic acid derivatives such as ethylene glycol dimethacrylate, butanediol dimethacrylate, trimethylolpropane trimethacrylate and methylenebis methacrylamide; acrylic acid derivatives having the same substituents as those listed above in connection with the methacrylic acid derivatives; and styrene derivatives such as divinylbenzene.

Group C: Other compounds having a polymerizable ethylenically unsaturated bond (which are preferably used in an amount ranging from 0 to 80 mole %).

Examples of such compounds which are preferably used in the present invention are methacrylic acid esters, acrylic acid esters, methacrylamides, acrylamides, styrenes, acrylonitrile and methacrylonitrile having not more than 20 carbon atoms.

When the microgel is prepared by dispersion polymerization, it is preferred to use a macromer or the like obtained by converting a terminus of a polyester oligomer into a (meth) acrylic acid ester residue.

The microgel of the present invention can preferably be obtained by emulsion polymerization or dispersion polymerization as has been described above. These polymerization techniques are detailed in, for instance, U.S. Pat. No. 3,895,082, U.K. Patent No. 967,051 and IMMUNOLOGICAL COMMUNICATIONS, 1983, 12 (5), pp. 509-517.

When the microgel is prepared by emulsion polymerization, it is usually necessary to prepare dried powder of the microgel prior to the preparation of the light-sensitive composition. The preparation of such dried powder of the microgel can be performed by a conventional technique which comprises aggregation, filtration, washing and drying operations. Alternatively, a proper organic solvent such as toluene may be used to obtain a dispersion in the organic solvent through azeotropic distillation of a water dispersion of the microgel, without forming powder thereof.

On the other hand, the microgels of the present invention having the functional group represented by the formula (II), which are preferably employed in the present invention, can preferably be prepared by subjecting the compounds respectively belonging to the following Groups D and E and optionally the compounds belonging to the following Group F, to emulsion polymerization or dispersion polymerization to form a microgel, and then reacting the microgel with the compounds belonging to the following Group G.

Group D: Compounds having a polymerizable ethylenically unsaturated bond and a functional group which is inert to the polymerization reaction, but is active to other reactions such as esterification and amidation (e.g., a hydroxyl group, a glycidyl group, a halogen atom and an amino group), which are preferably used in an amount ranging from 5 to 95 mole %.

Examples of such compounds preferably used in the present invention are (meth)acrylic acid derivatives such as 2-hydroxyethyl (meth)acrylate, 2-hydroxypropyl (meth)acrylate, polyethylene glycol mono(meth)acrylate, 2-(5-hydroxypentanoyloxy)ethyl (meth)acrylate, glycidyl (meth)acrylate, 2-chloroethyl (meth)acrylate, 2-bromoethyl (meth)acrylate, N-(p-hydroxyphenyl) (meth)acrylamide and N-(m-aminophenyl) (meth) acrylate; and styrene derivatives such as p-chloromethylstyrene.

Group E: The same as those listed in the foregoing Group B, which are preferably used in an amount ranging from 1 to 50 mole %.

Group F: The same as those listed in the foregoing Group C, which are preferably used in an amount ranging from 5 to 80 mole %.

Group G: Compounds having the functional group represented by the formula (II) and a functional group capable of reacting with the functional group of the Group D compound.

Examples of such compounds preferably used in the present invention are (meth)acrylic acid derivatives such as (meth) acrylic acid, (meth)acrylic acid chloride, (meth)acrylic anhydride, mixed acid anhydrides between (meth)acrylic acid and carbonic acid, and 2-(meth)acryloyloxyethyl isocyanate.

These microgels of the present invention can also preferably be obtained by emulsion polymerization or dispersion polymerization. These polymerization techniques are detailed in the foregoing various articles listed above in connection with the microgel having the functional group (I).

When the microgel is prepared by emulsion polymerization of the compounds of Groups D and E and the optional compound of Group F, it is usually necessary to prepare dried powder of the microgel prior to the reaction with the compound of Group F. The preparation of such dried powder of the microgel can be performed by a conventional technique which comprises aggregation, filtration, washing and drying operations. Alternatively, a proper organic solvent such as toluene may be used to obtain a dispersion in the organic solvent through azeotropic distillation of a water dispersion of the microgel, without forming powder thereof.

When the resulting microgel is reacted with the compound of Group G, the reaction is preferably carried out in the presence of a base such as pyridiene or an amine.

The light-sensitive composition comprising the microgel thus prepared must be developed with a developer comprising organic solvents after exposure to light since the microgel does not have proper alkaline-soluble groups. However, aqueous alkaline developers are preferably employed during the development in view of the safety of the working and sanitation conditions. This problem can be solved by incorporating an acidic group possessing a pKa value of not more than 14 into the microgel.

The microgels possessing such an acidic group, which are preferably used in the present invention, can be prepared by emulsion polymerization or dispersion polymerization of the compounds of Groups A and B and the optional compound of Group C (or the compounds of Groups D and E and the optional compound of Group F) in the presence of the following compounds of Group H.

Group H: Compounds having a polymerizable ethylenically unsaturated bond and an acidic group possessing a pKa value of not more than 14, which are preferably used in an amount ranging from 1 to 80 mole %.

Examples of the acidic group possessing a pKa value of not more than 14, which are preferably employed in the present invention, are $-SO_3H$, $-COOH$, $-CONHSO_2-$, $-CONHCO-$, $-SO_2NH-$, a phenolic hydroxyl groups, $-COCH_2COO-$,

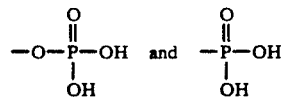

Examples of such compounds preferably employed in the present invention are (meth)acrylic acid; (meth)acrylic acid derivatives such as 3-(2-(meth)acryloyloxyethoxycarbonyl) propionic acid, N-(2-sulfo-1,1-dimethylethyl)(meth)acrylamide, N-(phenylsulfonyl)(meth)acrylamide, N-(p-sulfamoylphenyl)(meth) acrylamide, N-(p-hydroxyphenyl)(meth)acrylamide and 2-acetoacetoxyethyl (meth)acrylate; maleimides, styrene derivatives such as p-vinylbenzenesulfonic acid and compounds disclosed in E.P. No. 115,410 A2.

In this respect, the use of such a microgel as a component of a light-sensitive composition has been known from the disclosure of, for instance, J.P. KOKAI Nos. Sho 52-116301 and Sho 62-173455, but the microgels used therein do not substantially contain the functional group represented by the formula (I) or (II). Thus, these light-sensitive compositions are different from that of the present invention in this respect.

According to the second embodiment of the present invention, the light-sensitive composition comprises the microgel carrying a functional group represented by the general formula (III):

and at least one acidic group selected from the group consisting of $-SO_3H$, $-CONHSO_2-$, $-OCO-NH-SO_2-$, $-CONHCO-$, $-SO_2NH-$, a phenolic hydroxyl group, $-COCH_2COO-$,

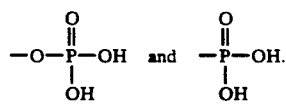

Such a microgel, which may be preferably used in the present invention, can be prepared by preferably emulsion polymerization or dispersion polymerization of the compounds belonging to the following Groups I to K and an optional compound belonging to the following Group L.

Group I: (Meth)acrylic acid derivatives having the functional group represented by the formula (III), which are preferably used in an amount ranging from 5 to 95 mole %.

Examples of the compounds, which can preferably be used in the invention, are allyl (meth)acrylate, allyl glycol (meth) acrylate and those disclosed in J. P. KOKAI Nos. Sho 59-46643, Sho 63-257749 and Hei 2-84651.

Group J: The same compounds as those listed above in Group H, which are preferably used in an amount ranging from 1 to 80 mole % in the present invention.

Particularly preferred are (meth)acrylic acid derivatives.

Group K: The same compounds as those listed above in Group B, which are preferably used in an amount ranging from 1 to 50 mole % in the present invention. Particularly preferred are (meth)acrylic acid derivatives.

Group L: The same compounds as those listed above in Group C, which are preferably used in an amount ranging from 0 to 80 mole % in the present invention.

In this case, the polymerization of the compounds of Groups I to L can be performed in substantially the same manner as in the polymerization of the microgel having the functional group represented by the formula (I) detailed above.

In the light-sensitive composition of the present invention, these microgels are used in an amount ranging from 5 to 95% by weight, preferably 10 to 90% by weight on the basis of the total weight of the light-sensitive composition.

The light-sensitive composition of the present invention, when the microgel having the functional group represented by the general formula (II) or (III) is used, may optionally comprise at least one photopolymerization initiator. As the photopolymerization initiators preferably used in the present invention, there may be mentioned, for instance, vicinal polyketaldonyl compounds as disclosed in U.S. Pat. No. 2,367,660; $\alpha$-carbonyl compounds as disclosed in U.S. Pat. Nos. 2,367,661 and 2,367,670; acyloin ethers as disclosed in U.S. Pat. No. 2,448,828; aromatic acyloin compounds whose $\alpha$-position is substituted with a hydrocarbon group as disclosed in U.S. Pat. No. 2,722,512; polynuclear quinone compounds as disclosed in U.S. Pat. No. 3,046,127; a combination of a triarylimidazole dimer and p-aminophenyl ketone as disclosed in U.S. Pat. No. 3,549,367; benzothiazole type compounds as disclosed in U.S. Pat. No. 3,870,524; acridine/phenadine compounds as disclosed in U.S. Pat. No. 3,751,259; and oxadiazole compounds as disclosed in U.S. Pat. No. 4,212,970.

Preferred typical examples thereof are trihalomethyl-s-triazine compounds or trihalomethyl oxadiazole compounds represented by the following general formula (IV) or (V) respectively:

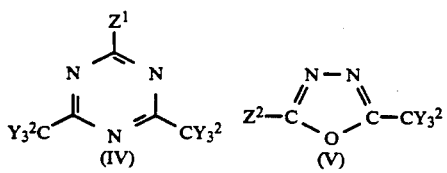

Wherein $Z^2$ represents a substituted or unsubstituted aryl or alkenyl group; $Z^1$ represents $Z^2$, —$CY^2_3$ or a substituted or unsubstituted alkyl group; and $Y^2$ represents a chlorine or bromine atom.

Examples of the compounds represented by the formula (IV) are those disclosed in WAKABAYASHI et al., Bull. Chem. Soc. Japan, 1969, 42, p. 2924; and those disclosed in U.K. Patent No. 1,388,492 and German Patent Nos. 2,718,259 and 3,337,024.

Typical examples thereof include 2-phenyl-4,6-bis(trichloro-methyl)-s-triazine, 2-(p-chlorophenyl)-4,6-bis(-trichloromethyl)-s-triazine, 2-(p-tolyl)-4,6-bis(tri-chloromethyl)-s-triazine, 2-(p-methoxyphenyl)-4,6-bis(-trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, 2-($\alpha,\alpha,\beta$-trichloroethyl)-4,6-bis(trichloromethyl)-s-triazine, 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine, 2-(4-(2-ethoxyethyl)-naphtho-1-yl)-4,6-bis(trichloromethyl)-s-triazine, 2-(4,7-dimethoxynaphtho-1-yl)-4,6-bis(trichloromethyl)-s-triazine, 2-(acenaphtho-5-yl)-4,6-bis(trichloromethyl)-s-triazine and 2-(4-styrylphenyl)-4,6-bis(trichloromethyl)-s-triazine.

On the other hand, as the compounds represented by the formula (V), there may be mentioned, for instance, those disclosed in J. P. KOKAI Nos. Sho 54-74728, Sho 55-77742 and Sho 59-148784.

Specific examples thereof are 2-styryl-5-trichloromethyl-1,3,4-oxadiazole, 2-(4-chlorostyryl)-5-trichloromethyl-1,3,4-oxadiazole, 2-(4-methylstyryl)-5-trichloromethyl-1,3,4-oxadiazole, 2-(4-methoxystyryl)-5-trichloromethyl-1,3,4-oxadiazole, 2-(4-butoxystyryl)-5-trichloromethyl-1,3,4-oxadiazole, 2-(4-styrylstyryl)-5-trichloromethyl-1,3,4-oxadiazole, 2-phenyl-5-trichloromethyl-1,3,4-oxadiazole, 2-(4-methoxyphenyl)-5-trichloromethyl-1,3,4-oxadiazole, 2-(3,4-dimethoxyphenyl)-5-trichloromethyl-1,3,4-oxadiazole, 2-(4-styrylphenyl)-5-trichloromethyl-1,3,4-oxadiazole and 2-(1-naphthyl)-5-trichloromethyl-1,3,4-oxadiazole.

Sensitizers may also be used in the light-sensitive composition of the present invention. Examples thereof include aromatic thiazole compounds disclosed in J. P. KOKOKU No. Sho 59-28328; merocyanine dyes disclosed in J. P. KOKAI No. Sho 54-151024; and aromatic thiopyrylium salts or aromatic pyrylium salts disclosed in J. P. KOKAI No. Sho 58-40302; as well as light-absorbing agents such as 9-phenylacridine, 5-nitroacenaphthyne and ketocoumarin. In addition, a combination of such a compound with a hydrogen donor such as N-phenyl glycine, 2-mercaptobenzothiazole or ethyl N,N'-dimethylaminobenzoate may also be effective for use in the composition of the present invention.

In the present invention, the amount of the photopolymerization initiator and/or the sensitizer are used in an amount preferably ranging from 0.01 to 20% by weight and more preferably 0.5 to 10% by weight on the basis of the total weight of the composition.

The light-sensitive composition of the present invention, when the microgel having the functional group represented by the general formula (I) is used, may optionally comprises photosensitizers. Triplet sensitizers having a maximum absorption at a wavelength of not less than 300 nm and capable of absorbing light in a pratically sufficient quantity are preferably used.

Preferred examples of such triplet sensitizers are benzophenone derivatives, benzanthrone derivatives, quinones, aromatic nitro compounds, naphthothiazoline derivatives, benzothiazoline derivatives, thioxanthones, naphthothiazole derivatives, ketocoumarin compounds, benzothiazole derivatives, benzodithiol derivatives, naphthofuranone compounds, pyrylium salts and thiapyrylium salts. Specific examples thereof are Michler's ketones, N,N'-diethylaminobenzophenone, benzanthrone, (3-methyl-1,3-diaza-1,9-benz)anthrone picramide, 5-nitroacenaphthene, 2-chlorothioxanthone, 2-isopropylthioxanthone, dimethylthioxanthone, methylthioxanthone-1-ethylcarboxylate, 2-nitrofluorene, 2-dibenzoylmethylene-3-methylnaphthothiazoline, 3,3-carbonyl-bis(7-diethylaminocoumarin), 2,4,6-triphenylthiapyrylium perchlorate, 2-(p-chlorobenzoyl) naphthothiazole, 2-(5-t-butyl-1,3-benzodithiol-2-ylidene)-1,3-diethylthiobarbituric acid. The amount of these triplet sensitizers ranges from 1 to 20% by weight, preferably 3 to 10% by weight on the basis of the total weight of the light-sensitive composition.

The light-sensitive composition of the present invention may optionally comprise, in addition to the foregoing components, an unsaturated monomer or oligomer, an alkali-soluble polymeric compound (resin), a diazo resin (having negative-working effects), a heat polymerization inhibitor or the like.

The unsaturated monomers or oligomers used in the light-sensitive composition of the present invention are preferably those having at least one addition-polymerizable unsaturated group. Particularly preferred are ethylene glycol di(meth) acrylate, polyethylene glycol di(meth)acrylate, trimethylolethane tri(meth)acrylate, trimethylolpropane tri(meth)acrylate, neopentyl glycol di(meth)acrylate, tri-, tetra- or hexa(meth)acrylates of pentaerythritol and dipentaerythritol, epoxy di(meth)acrylate, oligoacrylates as disclosed in J. P. KOKOKU No. Sho 52-7361, and acryl urethane resins or oligomers of acryl urethane as disclosed in J. P. KOKOKU No. Sho 48-41708.

The light-sensitive composition of the present invention can further comprise a known alkali-soluble polymeric compound such as polymers as disclosed in J. P. KOKAI Nos. Sho 52-988 and Sho 59-46643, phenol/formaldehyde resins, cresol/formaldehyde resins, phenol modified xylene resins, polyhydroxy styrene, carboxyl group-containing (meth)acrylate resins, carboxyl group-containing polyurethane resins or polyhalogenated hydroxystyrene.

These unsaturated monomers or oligomers or the foregoing alkali-soluble polymeric compounds are used in an amount of not more than 70% by weight on the basis of the total weight of the light-sensitive composition.

Examples of the diazo resins (having negative-working effects) usable in the present invention are reaction products obtained by condensing a diazo monomer listed below with a condensing agent in a molar ratio ranging from 1:1 to 1:0.5, preferably 1:0.8 to 1:0.6 in the usual manner and then reacting the resulting condensate with an anion. Examples of the diazo monomers are 4-diazo-diphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazodimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrroridinobenzene, 1-diazo-2-chloro-4-N,N-dimethylamino-5-methoxybenzene, 1-diazo-3-methoxy-4-pyrroridinobenzene, 3-methoxy-4-diazodiphenylamine, 3-ethoxy-4-diazodiphenylamine, 3-(n-propoxy)-4-diazodiphenylamine and 3-isopropoxy-4-diazodiphenylamine.

Examples of the condensing agents are formaldehyde, acetaldehyde, propionaldehyde, butyaldehyde, isobutylaldehyde and benzaldehyde.

Examples of the anions are tetrafluoroboric acid residue, hexafluorophosphoric acid residue, alkyl aromatic sulfonic acid residues such as triisopropylnaphthalenesulfonic acid residue and 2,5-dimethylbenzenesulfonic acid residue, 5-nitro-o-toluenesulfonic acid residue, 5-sulfosalicylic acid residue, 2,4,6-trimethylbenzenesulfonic acid residue, 2-nitrobenzenesulfonic acid residue, 3-chlorobenzenesulfonic acid residue, 3-bromobenzenesulfonic acid residue, 2-fluorocaprylnaphthalenesulfonic acid residue, dodecylbenzenesulfonic acid residue, 1-naphthol-5-sulfonic acid residue, 2-methoxy-4-hydroxy-5-benzoylbenzenesulfonic acid residue and p-toluenesulfonic acid residue. Among these anions, preferred are hexafluorophosphoric acid residue and alkyl aromatic sulfonic acid residue such as triisopropylnaphthalenesulfonic acid residue and 2,5-dimethylbenzenesulfonic acid residue.

Besides, useful examples of the diazo resins further include those obtained by condensing the foregoing diazo monomer and an aldehyde having a carboxyl and/or phenol group or its acetal (and optionally the foregoing condensing agent) and then reacting the condensate with the foregoing anion; as well as the diazo resins as disclosed in J. P. KOKAI Nos. Hei 1-102456 and Hei 1-102457.

These diazo resins are used in an amount of not more than 15% by weight, preferably 0.1 to 15% by weight and more preferably 0.3 to 5% by weight on the basis of the total weight of the composition.

These diazo resins can also be used as an intermediate layer (or an underlying layer) disposed between a substrate and a light-sensitive layer of a PS plate.

Examples of the heat polymerization inhibitors usable in the present invention are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

Moreover, the composition may comprise dyes or pigments for coloring the light-sensitive layer of a PS plate and a pH indicator or the like as a printing-out agent.

As a printing-out agent, there may be mentioned, for instance, combinations of organic dyes capable of forming a salt with a light-sensitive compound which releases an acid upon exposure to light.

When a diazo resin is used, the composition may optionally comprise a stabilizer for the diazo resin such as phosphoric acid, phosphorous acid, tartaric acid, citric acid, malic acid, dipicolinic acid, polynuclear aromatic sulfonic acid and salts thereof and sulfosalicylic acid.

In addition, the composition of the present invention may comprise a plasticizer, for instance, a dialkyl phthalate such as dibutylphthalate and dihexyl phthalate, an oligoethylene glycol alkyl ester or a malic acid ester type plasticizer.

The light-sensitive composition of the present invention is first dissolved or dispersed in a proper solvent and then applied onto a substrate. Examples of the solvent are toluene, 2-methoxyethanol, 2-methoxyethyl acetate, propylene glycol monomethyl ether, 3-methoxypropanol, 3-methoxypropyl acetate, methyl ethyl ketone, N,N-dimethylformamide, N,N-dimethylacetamide, dimethylsulfoxide, ethylene dichloride, methyl lactate, ethyl lactate and mixture thereof. The coated amount thereof in general ranges from 0.1 to 10 g/m$^2$, preferably 0.5 to 5 g/m$^2$ (on dry basis).

When the composition is a photopolymerizable composition, a protective layer is preferably provided on the light-sensitive layer in order to eliminate the polymerization-inhibiting effect due to oxygen in air. The protective layer preferably comprises a polymer excellent in oxygen barrier properties and examples thereof are polyvinyl alcohol and acidic celluloses. The methods for applying such a protective layer are detailed in, for instance, U.S. Pat. No. 3,458,311 and J. P. KOKOKU No. Sho 55-49729.

When a PS plate is prepared from the light-sensitive composition of the present invention, an aluminum plate is preferably used as a substrate. The aluminum plate includes pure aluminum plate and aluminum alloy plate. Examples of the aluminum alloy are those of aluminum and a metal such as silicon, copper, manganese, magnesium, chromium, zinc, lead, bismuth and nickel. The aluminum alloy may comprise small amount of iron and titanium as well as negligible amounts of impurities.

The aluminum plate is optionally subjected to a surface treatment. Examples of preferred surface treatments are graining, dipping in an aqueous solution of sodium silicate, potassium fluorozirconate or a phosphate and an anodization treatment. Moreover, preferred examples of the aluminum plates are those grained and then dipped in an aqueous solution of sodium silicate as disclosed in U.S. Pat. No. 2,714,066; and those obtained by anodizing an aluminum plate and then dipping it in an aqueous solution of an alkali metal silicate. The foregoing anodization treatment is performed by passing an electric current through an aluminum plate serving as an anode in an electrolyte such as an aqueous solution or non-aqueous solution of an inorganic acid such as phosphoric acid, chromic acid, sulfuric acid or boric acid, or an organic acid such as sulfamic acid, or a mixed solution thereof.

Alternatively, silicate electro-deposition as disclosed in U.S. Pat. No. 3,658,662 is also effective as a surface treatment for aluminum substrates.

These hydrophilization treatments are performed not only for making the surface of a substrate hydrophilic, but also for preventing detrimental reaction with the light-sensitive layer applied thereon and for improving the adhesion between the substrate and the light-sensitive layer.

It is also possible to subject the surface of an aluminum substrate to a pretreatment for removing a rolling oil and exposing the clean surface of the substrate, prior to graining an aluminum plate. Solvents such as trichlene, surfactants or the like are used for the removal of the rolling oil while it is general to use an alkali-etching agent such as sodium hydroxide and potassium hydroxide for exposing the clean surface of the substrate.

The graining may effectively be performed by any method such as mechanical, chemical and electrochemical ones. Examples of the mechanical graining method include a ball graining method, a blast graining method, and a brush graining method in which an aluminum plate is rubbed with a nylon brush using an aqueous dispersion of an abrasive such as pumice stone. As a chemical graining method, preferred is a method comprising dipping an aluminum plate in a saturated aqueous solution of an aluminum salt of a mineral acid as disclosed in J. P. KOKAI No. Sho 54-31187. On the other hand, as an electrochemical method, preferred is a method in which an aluminum plate is subjected to an AC electrolysis in an acidic electrolyte such as hydrochloric acid, nitric acid or mixture thereof. Particularly preferred are surface-roughening methods comprising a combination of mechanical and electrochemical surface-roughening treatments as disclosed in J. P. KOKAI No. Sho 55-137993 because they can provide strong adhesion between the substrate and the ink-receptive images.

The graining by the foregoing methods is preferably carried out so that the center line surface roughness (Ra) of the aluminum plate ranges from 0.3 to 1.0μ.

The aluminum plate thus grained is then optionally washed with water and chemically etched.

The etching solution is in general selected from aqueous solutions of bases or acids which can dissolve aluminum. In this case, the etching solution must not form a film derived from the components of the etching solution other than aluminum. Examples of preferred etching agents are basic substances such as sodium hydroxide, potassium hydroxide, sodium tertiary phosphate, sodium secondary phosphate, potassium tertiary phosphate and potassium secondary phosphate; and acidic substances such as sulfuric acid, persulfuric acid, phosphoric acid, hydrochloric acid and salts thereof. In this respect, the use of salts of metals having an ionization tendency lower than that of aluminum such as zinc, chromium, cobalt, nickel and copper are unfavorable because they form unnecessary films on the etched surface of the aluminum plate.

The concentration of the etching agent and the etching temperature are most preferably selected so that the the rate of dissolution of aluminum or an aluminum alloy with the etching agent is equal to 0.3 to 40 g/m$^2$ per unit dipping time (minute), but the rate is not critical and may be higher than the upper limit or lower than the lower limit.

The etching treatment is carried out by dipping an aluminum plate in the foregoing etching solution or applying the etching solution onto the aluminum plate. The etching treatment is preferably performed so that the amount to be etched is in the range of from 0.5 to 10 g/m$^2$.

It is desirable to use an aqueous solution of a base as an etching solution because it provides a high etching velocity. In this case, smut is formed and, therefore, the aluminum plate thus etched is in general desmutted. Examples of acids used in such a desmutting treatment are nitric acid, sulfuric acid, phosphoric acid, chromic acid, hydrofluoric acid and borofluoric acid.

The aluminum plate which is etched is optionally washed with water and anodized. The anodization may be performed in a manner usually employed in this field. More specifically, an anodized layer may be formed on the surface of the aluminum substrate by passing a DC or AC current through the aluminum plate in an aqueous solution or a non-aqueous solution of sulfuric acid, phosphoric acid, chromic acid, oxalic acid, sulfamic acid, benzenesulfonic acid or mixture thereof.

The anodization conditions vary depending on the kinds of the electrolytes used, but in general the anodization is carried out at an electrolyte concentration ranging from 1 to 80% by weight, a temperature of the electrolyte ranging from 5° to 70° C., a current density ranging from 0.5 to 60 A/dm$^2$ and a voltage ranging from 1 to 100 V. The anodization is carried out for 30 seconds to 50 minutes under the foregoing conditions.

Examples of preferred anodization treatments are a method for anodization at a high current density in a sulfuric acid solution as disclosed in U.K. Patent No. 1,412,768 and a method for anodization in which a phosphoric acid solution is used as an electrolyte as disclosed in U.S. Pat. No. 3,511,661.

The aluminum plate which is surface-roughened and further anodized may optionally be hydrophilized. Examples of such hydrophilization treatments are a method for treating it with an alkali metal silicate solution such as a sodium silicate aqueous solution disclosed in U.S. Pat. Nos. 2,714,066 and 3,181,461; a treatment with potassium fluorozirconate disclosed in J. P. KOKOKU No. Sho 36-22063 and a treatment with a polyvinylsulfonic acid solution disclosed in U.S. Pat. No. 4,153,461.

The aluminum substrates which are subjected to the foregoing treatments and then coated with an underlying layer of a water-soluble resin such as polyacrylic acid or a polymer or copolymer having a sulfonic acid residue at a side chain, or an alkaline water-soluble low molecular weight compound, a salt of triethanolamine, an alanine compound or the like.

The light-sensitive composition applied onto the surface of a substrate is exposed to light through a transparent original carrying an image or half-tone dot image and then developed with an aqueous alkaline developer to thus give a relief image negative to the original.

Examples of light sources used in the exposure are a carbon arc lamp, a mercury lamp, a xenon lamp, a metal halide lamp, a strobo, ultraviolet rays and laser rays.

Examples of the developer for the foregoing light-sensitive composition are aqueous alkaline solution containing a small amount of an organic solvent such as benzyl alcohol, 2-phenoxyethanol or 2-butoxyethanol, for instance, those disclosed in U.S. Pat. Nos. 3,475,171 and 3,615,480; as well as those disclosed in J. P. KOKAI Nos. Sho 50-26601, Sho 57-192951 and Sho 59-84241 and J. P. KOKOKU Nos. Sho 56-39464 and Sho 56-42860.

The light-sensitive composition of the present invention is excellent in sensitivity during exposure to light and thus can provide well-acceptable images even when it is exposed to light for only a short period of time. Thus, workability is substantially improved and the composition exhibits sufficient sensitivity even to a scanning exposure with laser rays.

The present invention will hereinafter be described in more detail with reference to the following Preparation Examples and non-limitative working Examples, and the effects practically achieved by the present invention will also be discussed in detail in comparison with Comparative Examples.

Preparation Example 1

126 g (1 mole) of 2,3-dimethyl maleic anhydride, 131 g (1 mole) of 6-aminocaproic acid and 600 ml of toluene were introduced into a 1 l flask equipped with a stirring machine and a condenser and were stirred for one hour while heating to 100° C. Then, a Dean-Stark water-separator was fitted to the flask and the contents were stirred for 3 hours while refluxing toluene and removing the water. After completion of the reaction, the reaction mixture was cooled and poured into 1.5 l of hexane to precipitate the reaction product. The precipitate was filtered off and dried. The resulting solid was dispersed in 1.5 l of water to form a slurry. Then, the slurry was filtered and the solid was dried, to give 231 g of the following compound (i) as a white solid.

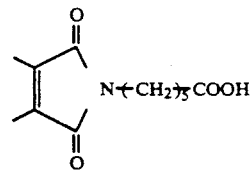

Then, 57.4 g (0.24 mole) of the compound (i) and 29.7 g (0.25 mole) of thionyl chloride were introduced into a 300 ml volume flask equipped with a stirring machine and a condenser and stirred for one hour at room temperature. Further, the contents was heated to 80° C. for one hour while stirring. After completion of the reaction, the content was cooled and 150 ml of ether was added thereto. Then a dropping funnel was fitted to the flask and a mixture of 26.0 g (0.2 mole) of 2-hydroxyethyl methacrylate and 31.6 g (0.4 mole) of pyridine was dropwise added to the reaction mixture through the dropping funnel over about 30 minutes while cooling the mixture with an ice-water bath. After the dropwise addition, the mixture was stirred for one hour under cooling with the ice-water bath and further stirred for additional 2 hours while heating to 50° C. After the reaction followed by cooling of the reaction mixture, it was introduced into a separatory funnel together with 400 ml of ethyl acetate. The mixture was washed, in order, with water, 1N hydrochloric acid, water, a saturated aqueous solution of sodium bicarbonate and water. The solution was dried over sodium sulfate and the solvent was distilled off under reduced pressure, to give 59 g of the following compound (ii) as a liquid:

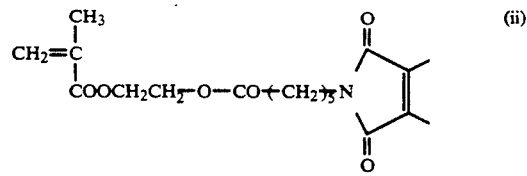

68.52 g (0.195 mole) of the compound (ii), 2.97 g (0.015 mole) of ethylene glycol dimethacrylate, 20.72 g (0.09 mole) of (2-methacryloyloxy)ethyl hydrogen succinate, 9.22 g of sodium dodecyl sulfate and 800 ml of water were introduced into a 1 l flask equipped with a stirring machine and a condenser and were heated to 50° C. under a nitrogen gas stream. To the resulting mixed solution, there were added 0.58 g of potassium persulfate and 0.54 g of sodium thiosulfate. 5H$_2$O and the mixture was stirred for 5 hours. After completion of the reaction, salting-out of the solution and collection of the resultant precipitate by centrifugation, the precipitate was dried under reduced pressure, to give 85 g of white powder (the microgel (p) of the present invention). It was confirmed by the observation with a microscope that the resulting powder comprised spherical particles.

Preparation Examples 2 to 5

The same procedures as in Preparation Example 1 were repeated, to give microgels (q) to (t) listed in the following Table I.

TABLE I

| Microgel | Structural Units | Molar Ratio |
|---|---|---|
| (q) | [methacrylate with COO-(CH2)5-N-maleimide] / [methacrylate with COO-Z-O-CO-Z-COOH] / [methacrylate with COO-Z-O-CO-C(CH3)(CH2)-] | 70/25/5 |
| (r) | [methacrylate with COO-Z-OCO-(CH2)5-N-maleimide] / [methacrylate with COO-Z-O-P(=O)(OH)(OH)] / [methacrylate with COO-Z-O-CO-C(CH3)(CH2)-] | 70/25/5 |
| (s) | [methacrylate with COO-Z-O-Z-N-maleimide] / [methacrylamide with CONH-C6H4-SO2NH2] / [methacrylate with COO-Z-O-CO-C(CH3)(CH2)-] | 60/32/8 |
| (t) | [methacrylate with COO-Z-O-Z-N-maleimide] / [methacrylamide with CONH-C6H4-OH] / [methacrylate with COOCH2Ph] / [methacrylate with COO-Z-O-CO-C(CH3)(CH2)-] | 60/26/6/8 |

EXAMPLE 1

An aluminum plate having a thickness of 0.30 mm was grained with a nylon brush and an aqueous dispersion of 400 mesh pumice stone and sufficiently washed with water. Then, the plate was etched by dipping it in a 10% sodium hydroxide solution at 70° C. for 60 seconds, washed with running water, neutralized and washed with a 20% $HNO_3$ solution, and then washed with water. The plate was electrolytically grained in a 1% aqueous solution of nitric acid using alternating sinusoidal current under the condition of $Va=12.7$ V so that the quantity of electricity at an anode time was 160 coulomb/$dm^2$. At this stage, the surface roughness was determined and it was found to be $0.6\mu$ (Ra unit). Subsequently, the aluminum plate was dipped in a 30% sulfuric acid solution at 55° C. for 2 minutes to desmut and then anodized for 2 minutes in a 20% aqueous sulfuric acid solution at a current density of 2 A/$dm^2$ so that the thickness of the resulting anodized layer was 2.7 g/$m^2$.

Each of the following light-sensitive solutions (V)-1 to (V)-5 was applied onto the substrate thus prepared with a whirler and dried at 80° C. for 2 minutes. The coated amount thereof was 1.5 g/$m^2$ (on dry basis).

The microgels of the present invention used in the light-sensitive solutions (V)-1 to (V)-5 are listed in the following Table II.

| Light-sensitive Solution (V): | |
|---|---|
| Component | Amount (g) |
| Microgel of the present invention (see Table III) | 5 |

-continued

| Light-sensitive Solution (V): | |
|---|---|
| Component | Amount (g) |
| Sensitizer represented by the following structural formula: | 0.25 |

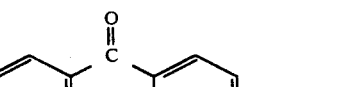

| Propylene glycol monomethyl ether | 50 |
| Methyl ethyl ketone | 50 |
| Megafac F-177 (fluorine atom-containing surfactant available form DAINIPPON INK AND CHEMICALS, INC.) | 0.03 |
| 10% Dispersion of Cu-phthalocyanine pigment (C.I. Pigment Blue 15) in a plasticizer | 1.0 |

Then, as Comparative Example, a light-sensitive solution (W) which had the same composition as that of the solution (V) except that the following polymeric compound, which did not have a cross-linked structure was substituted for the microgel of the present invention, was likewise applied onto the aluminum substrate prepared above and then dried in the same manner as Example 1.

Polymeric Compound used in Comparitive Example:

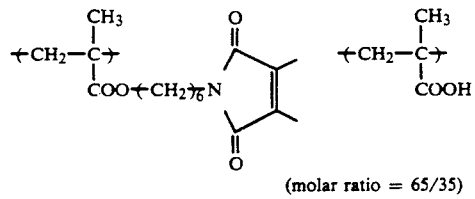

(molar ratio = 65/35)

A gray scale tablet available from Fuji Photo Film Co., Ltd. was put on each of the PS plates (V)-1 to (V)-5 and (W) which had been prepared using the light-sensitive solutions (V)-1 to (V)-5 and (W) respectively, each assembly was exposed to light with Berkey Printer (available from U.S. Berkey Technical Co., Ltd.), dipped in the following developer at room temperature for 50 seconds and the surface thereof was lightly rubbed with absorbent wadding to remove the non-exposed portions.

| Developer: | |
|---|---|
| Component | Amount (g) |
| Sodium sulfite | 5 |
| Benzyl alcohol | 30 |
| Ethanolamine | 5 |
| Sodium isopropylnaphthalenesulfonate | 12 |
| Pure water | 1000 |

The sensitivity of each PS plate with respect to the quantity of the exposed light was visually evaluated from the number of the solid steps. The results obtained are listed in Table II given below.

TABLE II

| PS Plate | Microgel Used | Number of Solid Steps after Development |
|---|---|---|
| (V)-1 | (p) | 6 |
| (V)-2 | (q) | 5 |
| (V)-3 | (r) | 4 |
| (V)-4 | (s) | 5 |
| (V)-5 | (t) | 4 |
| (W) (Comp.Ex.) | — | 3 |

As seen from the results listed in Table II, the number of the solid steps of the PS plates (V)-1 to (V)-5 in which the microgels of the present invention were used are greater than that for the comparative PS plate (W). Thus, it can be concluded that the sensitivity of these PS plates of the present invention is very high.

Preparation Example 2

25.38 g (0.195 mole) of 2-hydroxyethyl methacrylate, 4.27 g (0.03 mole) of n-butyl methacrylate, 2.97 g (0.015 mole) of ethylene glycol dimethacrylate, 13.81 g (0.06 mole) of (2-methacryloyloxy)ethyl hydrogen succinate, 4.63 g of sodium dodecyl sulfate and 750 ml of water were introduced into a 1 l flask equipped with a stirring machine and a condenser and were heated to 50° C. under a nitrogen gas stream. To the resulting mixed solution, there were added 0.58 g of potassium persulfate and 0.54 g of sodium thiosulfate . 5H$_2$O and the mixture was stirred for 5 hours. After completion of the reaction, saltingout of the solution and collection of the resulting precipitate by centrifugation, the precipitate was dried under reduced pressure, to give 43 g of white powder.

10 g of the resulting white powder and 100 ml of pyridine were introduced into a 200 ml volume flask equipped with a stirring machine and a condenser and were stirred in an ice-water bath. To the mixture, there was slowly added 10 g of methacrylic acid chloride and subsequently the mixture was stirred for 30 minutes in ice-water bath. Then, it was heated to 50° C. for 2 hours while stirring.

After the reaction, the mixture was poured into 1 l of ice-water while stirring and acidified by the addition of hydrochloric acid. The precipitate was filtered off, washed with an aqueous solution of sodium chloride sufficiently and then dried under reduced pressure, to give 9 g of white powder (the microgel (p') of the present invention). It was confirmed by observation with a microscope that the resulting powder comprised spherical particles.

The same procedures as in Preparation Example 2 were repeated to give microgels (q') and (z') listed in the following Table III.

TABLE III

| Microgel | Structural Units | Molar Ratio |
|---|---|---|
| (p') | (structures) | 65/10/20/5 |
| (q') | (structures) | 72/20/8 |
| (r') | (structures) | 70/25/10 |
| (s') | (structures) | 75/15/10 |
| (t') | (structures) | 50/20/25/5 |

TABLE III-continued
| Microgel | Structural Units | | | Molar Ratio |
|---|---|---|---|---|
| (u') | 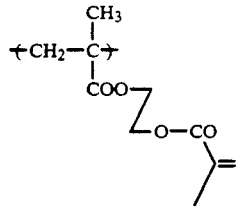 | | | 75/15/10 |
| (v') | 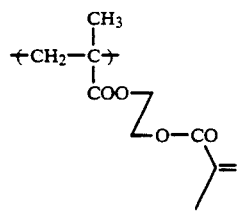 | | | 75/15/5 |
| (w') | 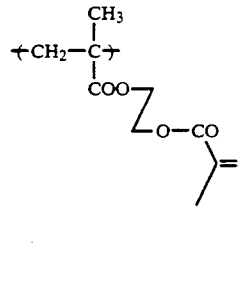 | | | 70/20/10 |
| (x') | 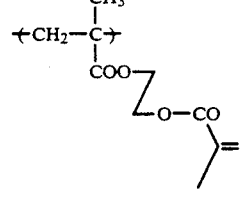 | | | 70/20/10 |
| (y') | 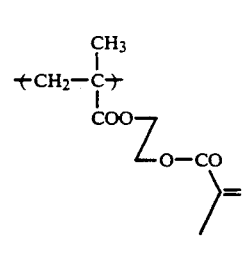 | | | 65/25/10 |
| (z') | 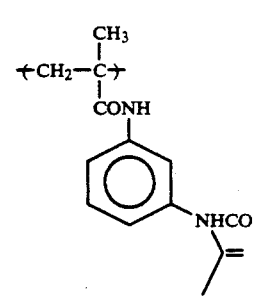 | | | 60/30/10 |
EXAMPLE 2
A substrate was prepared according to the method disclosed in J. P. KOKAI No. Sho 56-28893. More specifically, an aluminum plate having a thickness of 0.24 mm was grained with a nylon brush and an aqueous dispersion of 400 mesh pumice stone and sufficiently washed with water. Then, the plate was etched by dipping it in a 10% sodium hydroxide solution at 70° C. for 60 seconds, washed with running water, neutralized and washed with a 20% $HNO_3$ solution, and then washed with water. The plate was electrolytically grained in a 1% aqueous solution of nitric acid using alternating sinusoidal current under the conditions that a ratio of the quantity of cathode time electricity to that of anode time electricity of 0.8 and an anode time voltage of 12.7 V so that the anodic quantity of electricity was 160 coulomb/$dm^2$. At this stage, the surface roughness was determined to be 0.6μ (Ra unit). Subsequently, the aluminum plate was dipped in a 30% sulfuric acid solution at 55° C. for 2 minutes to desmut and then anodized for 2 minutes in a 20% sulfuric acid solution at a current density of 2 A/$dm^2$ so that the thickness of the resulting anodized layer was 2.7 g/$m^2$. Thereafter, the plate was dipped in a 2.5% aqueous solution of sodium silicate maintained at 70° C. for one minute, then washed with water and dried. Each of the following light-sensitive solutions (V')-1 to (V')-11 was applied onto the substrate thus prepared.

The microgels of the present invention used in the light-sensitive solutions (V')-1 to (V')-11 are listed in the following Table IV.

| Light-sensitive Solution (V'): | |
|---|---|
| Component | Amount (g) |
| Microgel of the present invention (see TABLE IV) | 3.25 |
| Pentaerythritol tetraacrylate | 1.75 |
| 2-Trichloromethyl-5-(p-n-butoxystyryl)-1,3,4-oxadiazole | 0.2 |
| Oil-soluble blue dye (C.I. 42595) | 0.08 |
| Methyl ethyl ketone | 20 |
| 2-Methoxyethanol | 20 |

These components were dissolved and dispersed in the solvent and the resulting light-sensitive solution was applied onto the surface of the aluminum substrate prepared above with a whirler at a rate of revolution of about 200 r.p.m. Then, the coated layer was dried at 100° C. for 2 minutes. The coated amount thereof was 3 g/$m^2$ (on dry basis). Then, a 3% by weight aqueous solution of polyvinyl alcohol (viscosity as determined by Höppler method on a 4% solution at 20° C.=5.3±0.5 (cp); degree of saponification=86.5 to 89.0 mole %; degree of polymerization=not more than 1,000) was applied onto the light-sensitive layer with a whirler at about 180 r.p.m. The coated amount (on dry basis) of the solution was 1.5 g/$m^2$.

As Comparative Example, a light-sensitive solution (W') wherein the allylmethacrylate/methacrylic acid copolymer (molar ratio of 85/15) as described in the example of J. P. KOKAI No. Sho 59-46643 was used in place of the microgel of the above light-sensitive solution, was prepared and applied on the aluminum plate in the same manner as the above. Then, the polyvinyl alcohol was provided on the light-sensitive layer in the same manner as in the above, to prepare a PS plate (W').

A gray scale tablet available from Fuji Photo Film Co., Ltd. was put on each of the PS plates (V')-1 to (V')-11 and (W') which had been prepared using the light-sensitive solutions (V')-1 to (V')-11 and (W') respectively, the assembly was exposed to light with Berkey Printer, dipped in the developer used in Example 1 at room temperature for 50 seconds and the surface thereof was lightly rubbed with absorbent wadding to remove the non-exposed portions.

The sensitivity of each PS plate with respect to the quantity of the exposed light was visually evaluated from the number of the solid steps. The results obtained are listed in Table IV given below.

TABLE IV

| PS Plate | Microgel Used | Number of Solid Steps after Development |
|---|---|---|
| (V')-1 | (p') | 7 |
| (V')-2 | (q') | 6 |
| (V')-3 | (r') | 7 |
| (V')-4 | (s') | 5 |
| (V')-5 | (t') | 5 |
| (V')-6 | (u') | 5 |
| (V')-7 | (v') | 6 |
| (V')-8 | (w') | 6 |
| (V')-9 | (x') | 5 |
| (V')-10 | (y') | 5 |
| (V')-11 | (z') | 6 |
| (W') (Comp.Ex.) | — | 4 |

As seen from the results listed in Table IV, the number of the solid steps of the PS plates (V')-1 to (V')-11 in which the microgels of the present invention were used are greater than that for the comparative PS plate (W'). Thus, it is confirmed that the sensitivity of these PS plates of the present invention is very high.

Preparation Example 3

28.38 g (0.225 mole) of allyl methacrylate, 2.97 g (0.015 mole) of ethylene glycol dimethacrylate, 12.85 g (0.06 mole) of 2-acetoacetoxyethyl methacrylate, 4.52 g of sodium dodecyl sulfate and 750 ml of water were introduced into a 1 l flask equipped with a stirring machine and a condenser and were heated to 50° C. under a nitrogen gas stream. To the resulting solution, there were added 0.58 g of potassium persulfate and 0.54 g of sodium thiosulfate.$5H_2O$ and the mixture was stirred for 5 hours. After completion of the reaction, salting-out of the solution and collection of the resulting precipitate by centrifugation, the precipitate was dried under reduced pressure to give 41 g of white powder (the microgel (p") of the present invention). It was confirmed by observation with a microscope that the resulting powder comprised spherical particles.

The same procedures as in Preparation Example 3 were repeated to give microgels (q") to (y") listed in the following Table V.

TABLE V

| Microgel | Structural Units | Molar Ratio |
|---|---|---|
| (p″) | [methacrylate with allyl ester] / [methacrylate-OCOCH$_2$COCH$_3$] / [methacrylate-O-CO-C(CH$_3$)(CH$_2$)-] | 75/20/5 |
| (q″) | [methacrylate with allyl ester COO-CH$_2$CH=CH$_2$] / [methacrylate-CONHSO$_2$Ph] / [methacrylate-O-CO-C(CH$_3$)(CH$_2$)-] | 75/20/8 |
| (r″) | [methacrylate with vinyl ether COO-CH$_2$-O-CH=CH$_2$] / [methacrylate-CONH-C$_6$H$_4$-OH] / [methacrylate-O-CO-C(CH$_3$)(CH$_2$)-] | 75/15/10 |
| (s″) | [methacrylate-COO-CH=CH$_2$] / [methacrylate-COO-CH$_2$-OH] / [methacrylate-CONH-C$_6$H$_4$-SO$_2$NH$_2$] / [methacrylate-O-CO-C(CH$_3$)(CH$_2$)-] | 70/50/20/5 |
| (t″) | [methacrylate with vinyl ether COO-CH$_2$-O-CH=CH$_2$] / [methacrylate-COOCH$_2$Ph] / [methacrylate-O-P(O)(OH)$_2$] / [methacrylate-O-CO-C(CH$_3$)(CH$_2$)-] | 65/10/10/15 |

TABLE V-continued

| Microgel | Structural Units | Molar Ratio |
|---|---|---|
| (u″) | —(CH₂—C(CH₃)(CONH—CH₂CH=CH₂))— ; —(CH₂—C(CH₃)(COO—Z—OCOCH₂COCH₃))— ; —(CH₂—C(CH₃)(COO—Z—O—CO—(C(CH₃)—CH₂)—CH₃))— | 70/20/10 |
| (v″) | —(CH₂—C(CH₃)(COO—CH₂CH=CH₂))— ; —(CH₂—C(CH₃)(COO—Z—O—CO—NH—SO₂—Ph))— ; —(CH₂—C(CH₃)(COO—Z—O—CO—(C(CH₃)—CH₂)—CH₃))— | 68/25/7 |
| (w″) | —(CH₂—C(CH₃)(COO—CH₂CH=CH₂))— ; —(CH₂—CH(CONH—C(CH₃)₂—CH₂—SO₃H))— ; —(CH₂—C(CH₃)(COO—Z—O—CO—(C(CH₃)—CH₂)—CH₃))— | 75/15/10 |
| (x″) | —(CH₂—C(CH₃)(COO—CH₂CH=CH₂))— ; —(CH₂—C(CH₃)(CONH—C₆H₄—CH₂—P(O)(OH)₂))— ; —(CH₂—C(CH₃)(COO—Z—O—CO—(C(CH₃)—CH₂)—CH₃))— | 70/20/8 |
| (y″) | —(CH₂—C(CH₃)(COO—Z—O—Z))— ; —(CH—CH(maleimide: N—H, 2×C=O))— ; —(CH₂—C(CH₃)(COO—Z—O—CO—(C(CH₃)—CH₂)—CH₃))— | 65/25/10 |

EXAMPLE 3

An aluminum substrate was treated in the same manner as Example 2 and each of the following light-sensitive solutions (V‴)-1 to (V‴)-10 was applied onto the resultant substrate.

The microgels of the present invention used in the light-sensitive solutions (V‴)-1 to (V‴)-10 are listed in the following Table VI.

| Light-sensitive Solution (V‴): | |
|---|---|
| Component | Amount (g) |
| Microgel of the present invention (see TABLE IV) | 3.25 |
| Pentaerythritol tetraacrylate | 1.75 |
| 2-Trichloromethyl-5-(p-n-butoxystyryl)- | 0.2 |

| -continued | |
|---|---|
| Light-sensitive Solution (V‴): | |
| Component | Amount (g) |
| 1,3,4-oxadiazole | |
| Oil-soluble blue dye (C.I. 42595) | 0.08 |
| Methyl ethyl ketone | 20 |
| 2-Methoxyethanol | 20 |

These components were dissolved and dispersed in the solvent and the resulting light-sensitive solution was applied onto the surface of the aluminum substrate prepared above with a whirler at a rate of revolution of about 200 r.p.m. Then, the coated layer was dried at 100° C. for 2 minutes. The coated amount thereof was 3 g/m² (on dry basis). Then, a 3% by weight aqueous solution of polyvinyl alcohol (viscosity as determined by Höppler method on a 4% solution at 20° C.=5.3±0.5 (cp); degree of saponification=86.5 to 89.0 mole %; degree of polymerization=not more than 1,000) was applied onto the light-sensitive layer with a whirler at about 180 r.p.m. The coated amount (weighed after drying) was 1.5 g/m².

Then, as Comparative Example, a light-sensitive solution (W'''), which had the same composition as that of the light-sensitive solution (V''') except that an allyl methacrylate/methacrylic acid copolymer (molar ratio=85/15) was used in place of the microgel of the present invention, was applied onto the aluminum substrate and then the same polyvinyl alcohol layer was likewise formed.

A gray scale tablet available from Fuji Photo Film Co., Ltd. was put on each of the PS plates (V''')-1 to (V''')-10 and (W''') which had been prepared using the light-sensitive solutions (V''')-1 to (V''')-10 and (W''') respectively, the assembly was exposed to light with Berkey Printer, dipped in the following developer at room temperature for 50 seconds and the surface thereof was lightly rubbed with absorbent wadding to remove the non-exposed portions.

| Developer: | |
|---|---|
| Component | Amount (g) |
| Sodium sulfite | 5 |
| Benzyl alcohol | 30 |
| Ethanolamine | 5 |
| Sodium isopropylnaphthalenesulfonate | 12 |
| Pure water | 1000 |

The sensitivity of each PS plate with respect to the quantity of the exposed light was visually evaluated from the number of the solid steps. The results obtained are listed in Table VI given below.

TABLE VI

| PS Plate | Microgel Used | Number of Solid Steps after Development |
|---|---|---|
| (V''')-1 | (p') | 6 |
| (V''')-2 | (q') | 5 |
| (V''')-3 | (r') | 6 |
| (V''')-4 | (s') | 5 |
| (V''')-5 | (t') | 5 |
| (V''')-6 | (u') | 7 |
| (V''')-7 | (v') | 6 |
| (V''')-8 | (w') | 5 |
| (V''')-9 | (x') | 5 |
| (V''')-10 | (y') | 6 |
| (W''') (Comp.Ex.) | — | 4 |

As seen from the results listed in Table VI, the number of the solid steps of the PS plates (V''')-1 to (V''')-10 in which the microgels of the present invention were used are greater than that for the comparative PS plate (W'''). Thus, it can be concluded that the sensitivity of these PS plates of the present invention is very high.

What is claimed is:

1. A photohardenable composition comprising a microgel carrying a group represented by the following general formula (I):

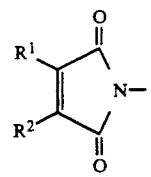

wherein $R^1$ and $R^2$ each represents a hydrogen atom, a halogen atom, or an alkyl or aryl group, provided that $R^1$ and $R^2$ may form a ring together with the carbon atoms to which they are bonded.

2. The photohardenable composition of claim 1 wherein in the general formula (I), the substituents $R^1$ and $R^2$ each represents a hydrogen atom, a chlorine atom, a bromine atom, a $C_1$ to $C_6$ alkyl group or a substituted or unsubstituted phenyl group, provided that $R^1$ and $R^2$ may form a ring together with the carbon atoms to which they are bonded.

3. The photohardenable composition of claim 1 wherein said microgel carrying the group represented by the general formula (I) is obtained by emulsion polymerization or dispersion polymerization of compounds belonging to the following Groups A and B:

Group A: 10 to 99 mole % of a compound having the photocrosslinkable group represented by the formula (I) and a polymerizable ethylenically unsaturated bond, which compound being selected from the group consisting of:

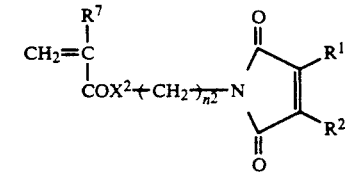

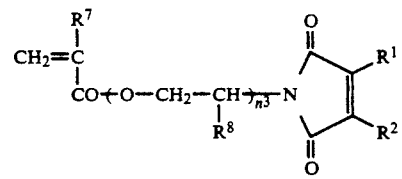

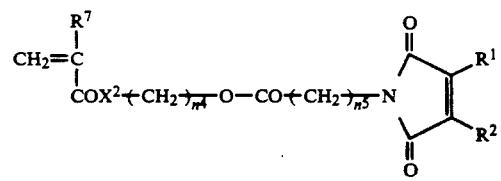

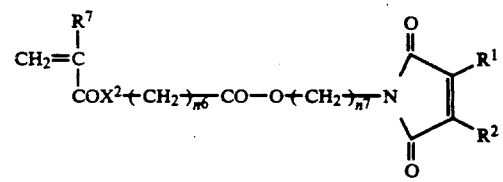

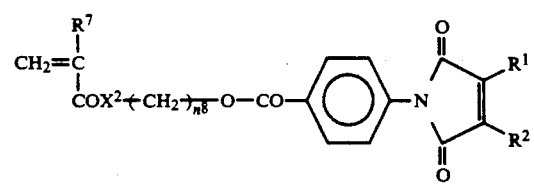

-continued

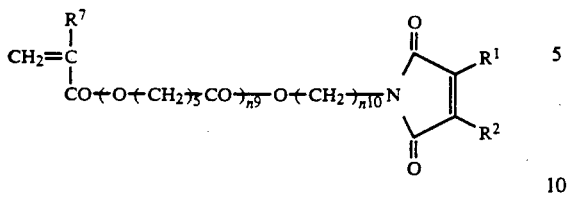

wherein $R^1$ and $R^2$ have the same meanings as defined in claim 1; $R^7$ and $R^8$ each represents a hydrogen atom or a methyl group; $X^2$ represents —O— or —NH—; $n^2$ to $n^{10}$ each represents an integer of not less than 1; and Group B: 1 to 50 mole % of a compound carrying at least two polymerizable ethylenically unsaturated bonds in the molecule, selected from the group consisting of acrylates, methacrylates, acrylamides, methylacrylamides and styrenes.

4. The photohardenable composition of claim 3 wherein the emulsion polymerization or dispersion polymerization is carried out in the presence of an amount of up to 80 mole % of a compound having a polymerizable ethylenically unsaturated bond which is selected from the group consisting of (meth)acrylic acid esters, (meth)acrylamides, styrenes, and (meth)acrylonitriles having not more than 20 carbon atoms.

5. The photohardenable composition of claim 3 wherein the compound belonging to Group B is selected from the group consisting of ethylene glycol dimethacrylate, butanediol dimethacrylate, trimethylolpropane trimethacrylate, methylene-bismethacrylamide, ethylene glycol diacrylate, butanediol diacrylate, trimethylolpropane triacrylate, methylene-bisacrylamide and divinylbenzene.

6. The photohardenable composition of claim 1 wherein said microgel further has an acidic group possessing a pKa value of not more than 14.

7. The photohardenable composition of claim 6 wherein said acidic group is at least one member selected from the group consisting of —SO$_3$H, —COOH, —CONHSO$_2$—, —CONHCO—, —SO$_2$NH—, a phenolic hydroxyl groups, —COCH$_2$COO—,

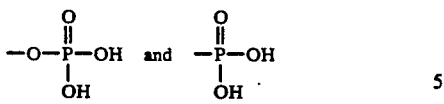

8. The photohardenable composition of claim 6 wherein the microgel carrying an acidic group possessing a pKa of not more than 14 is obtained by emulsion polymerization or dispersion polymerization of the following compounds belonging to Groups A and B:

Group A: 10 to 99 mole % of a compound having the photocrosslinkable group represented by the formula (I) and a polymerizable ethylenically unsaturated bond, which compound being selected from the group consisting of:

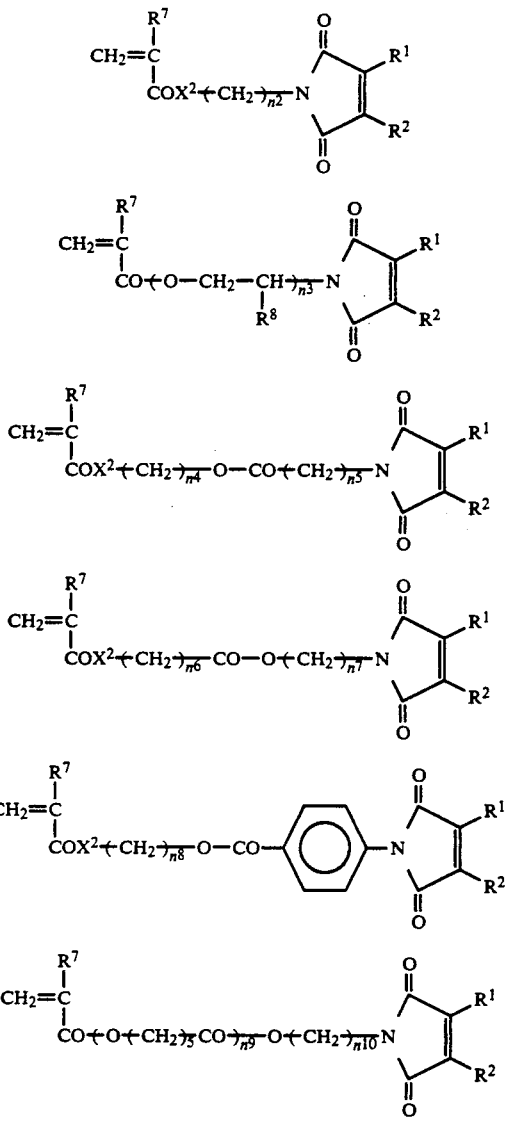

wherein $R^1$ and $R^2$ have the same meansings as defined in claim 1; $R^7$ and $R^8$ each represents a hydrogen atom or a methyl group; $X^2$ represents —O— or —NH—; $n^2$ to $n^{10}$ each represents an integer of not less than 1; and Group B: 1 to 50 mole % of a compound carrying at least two polymerizable ethylenically unsaturated bonds in the molecule, selected from the group consisting of acrylates, methacrylates, acrylamides, methacrylamides and styrenes in the presence of a compound belonging to the following Group H:

Group H: 1 to 80 mole % of a compound having a polymerizable ethylenically unsaturated bond and an acidic group possessing a pKa of not more than 14, which compound is selected from the group consisting of (meth)acrylic acid, acrylic acid, acrylates, methacrylates, acrylamide, methacrylamides, maleimides, and styrenes.

9. The photohardenable composition of claim 1 wherein the amount of the microgel ranges from 5 to 95% by weight of the total weight of the light-sensitive composition.

10. The photohardenable composition of claim 9 wherein the amount of the microgel ranges from 10 to 90% by weight on the basis of the total weight of the light-sensitive composition.

* * * * *